(12) United States Patent
Leuten et al.

(10) Patent No.: US 11,811,182 B2
(45) Date of Patent: Nov. 7, 2023

(54) SOLDERLESS BGA INTERCONNECT

(71) Applicant: Intel Corporation, Santa Clara, CA (US)

(72) Inventors: Tyler Leuten, Orangevale, CA (US); Mohammed Rahman, Folsom, CA (US); Bilal Khalaf, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 1246 days.

(21) Appl. No.: 16/157,184

(22) Filed: Oct. 11, 2018

(65) Prior Publication Data

US 2020/0119467 A1    Apr. 16, 2020

(51) Int. Cl.
*H01R 4/58* (2006.01)
*H01L 23/498* (2006.01)
(Continued)

(52) U.S. Cl.
CPC ......... *H01R 4/58* (2013.01); *H01L 23/49816* (2013.01); *H01L 23/49866* (2013.01); *H01R 4/04* (2013.01); *H01R 4/48* (2013.01); *H05K 1/181* (2013.01); *H05K 3/321* (2013.01); *H05K 3/325* (2013.01); *H01R 43/027* (2013.01); *H05K 2201/10393* (2013.01); *H05K 2201/10598* (2013.01); *H05K 2201/10734* (2013.01); *H05K 2201/10909* (2013.01)

(58) Field of Classification Search
CPC ........ H05K 1/181; H05K 3/321; H05K 3/325; H05K 2201/10393; H05K 2201/10598; H05K 2201/10734; H05K 2201/10909; H01L 23/49818; H01L 23/49866; H01R 4/04; H01R 4/48; H01R 4/58; H01R 43/027
See application file for complete search history.

(56) References Cited

U.S. PATENT DOCUMENTS 4,161,346 A * 7/1979 Cherian ............... H01R 12/714
439/515
5,476,211 A * 12/1995 Khandros ............ H05K 3/3426
257/E21.507
(Continued)

OTHER PUBLICATIONS

IBM Tech. Disc. vol. 37, No. 5, May 1984 "Flexible Power Connection for Array Applications" by Brodsky et al.*

*Primary Examiner* — Peter Dungba Vo
*Assistant Examiner* — Jose K Abraham
(74) *Attorney, Agent, or Firm* — Schwabe, Williamson & Wyatt, P.C.

(57) ABSTRACT

Embodiments disclosed herein include electronics packages and methods of forming such packages. In an embodiment, the electronics package comprises a first substrate and a plurality of first conductive pads on the first substrate. In an embodiment, the electronics package further comprises a second substrate and a plurality of second conductive pads on the second substrate. In an embodiment, the electronics package further comprises a plurality of interconnects between the first and second substrate. In an embodiment, each interconnect electrically couples one of the first conductive pads to one of the second conductive pads. In an embodiment, the interconnects comprise strands of conductive material that are woven on themselves to form a mesh-like structure.

21 Claims, 6 Drawing Sheets

(51) Int. Cl.
   *H05K 1/18* (2006.01)
   *H01R 4/04* (2006.01)
   *H01R 4/48* (2006.01)
   *H05K 3/32* (2006.01)
   *H01R 43/027* (2006.01)

(56) References Cited

U.S. PATENT DOCUMENTS

| | | | | |
|---|---|---|---|---|
| 5,938,451 | A * | 8/1999 | Rathburn | H01R 13/2414 439/71 |
| 6,079,987 | A * | 6/2000 | Matsunaga | H01R 13/2414 439/66 |
| 6,524,115 | B1 * | 2/2003 | Gates | G01R 1/06716 439/67 |
| 6,695,623 | B2 * | 2/2004 | Brodsky | H01R 12/52 439/561 |
| 6,830,460 | B1 * | 12/2004 | Rathburn | H05K 3/326 439/66 |
| 7,833,020 | B1 * | 11/2010 | Ma | H01R 13/2407 439/66 |
| 9,350,093 | B2 * | 5/2016 | Rathburn | H01R 12/52 |
| 2004/0192080 | A1 * | 9/2004 | Li | H01L 24/72 257/E23.068 |
| 2004/0244193 | A1 * | 12/2004 | Jung | H05K 3/363 439/495 |
| 2005/0048806 | A1 * | 3/2005 | Li | H01R 12/714 257/E23.068 |
| 2006/0141814 | A1 * | 6/2006 | Li | H01L 23/49827 439/66 |
| 2006/0141815 | A1 * | 6/2006 | Li | H01L 23/49811 439/66 |
| 2006/0141832 | A1 * | 6/2006 | Li | H01R 13/33 439/120 |
| 2006/0189176 | A1 * | 8/2006 | Li | H01R 12/714 257/E23.068 |
| 2006/0211276 | A1 * | 9/2006 | Li | H01R 13/2407 439/66 |
| 2008/0182103 | A1 * | 7/2008 | Chung | D02G 3/441 57/232 |
| 2011/0094785 | A1 * | 4/2011 | Howell | H01R 43/007 29/881 |
| 2012/0074592 | A1 * | 3/2012 | Luan | H01L 24/97 257/777 |

* cited by examiner

SOLDERLESS BGA INTERCONNECT

TECHNICAL FIELD

Embodiments of the present disclosure relate to electronics packaging, and more particularly, to solder-free interconnects.

BACKGROUND

Ball grid array (BGA) solder balls are the primary means of physical and electrical coupling between a package, a printed circuit board (PCB), and/or a substrate. Solder balls are prone to failure over time due to vibration, temperature cycling, and internal and external stresses. A solder ball failure leads to an electrical disconnect. Solder balls also exhibit physical stresses on a package and any internal structures. Furthermore, the use of solder balls requires at least two high temperature reflow operations to attach the solder balls to the substrate and to attach the package to the PCB. Some products are adversely affected by such high-temperature reflow operations.

In research and development (R&D) environments, the solder balls may be replaced with sockets. However, such socket architectures are not suitable for use in consumer products due to their large form-factors.

EMBODIMENTS OF THE PRESENT DISCLOSURE

Described herein are electronics packages with solderless interconnects and methods of forming such electronics packages. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, BGA solder balls are prone to failure due to temperature cycling and internal and external stresses experienced during the use of an electronics package. Accordingly, embodiments disclosed herein include a solder-free interconnect architecture. The solder-free interconnect architectures disclosed herein allow for the internal and external stresses to be absorbed by the interconnect without failing. Furthermore, the solder-free interconnect architectures disclosed herein do not require any reflows. As such, components of the electronics package are not subjected to high temperature cycling that may negatively affect the components. Additionally, embodiments described herein provide a solder-free interconnect that has a form factor that closely matches the form factor of solder balls. Accordingly, bulky socket architectures are avoided and there is not a significant change in the Z-height of the electronics package.

Figure 1A:
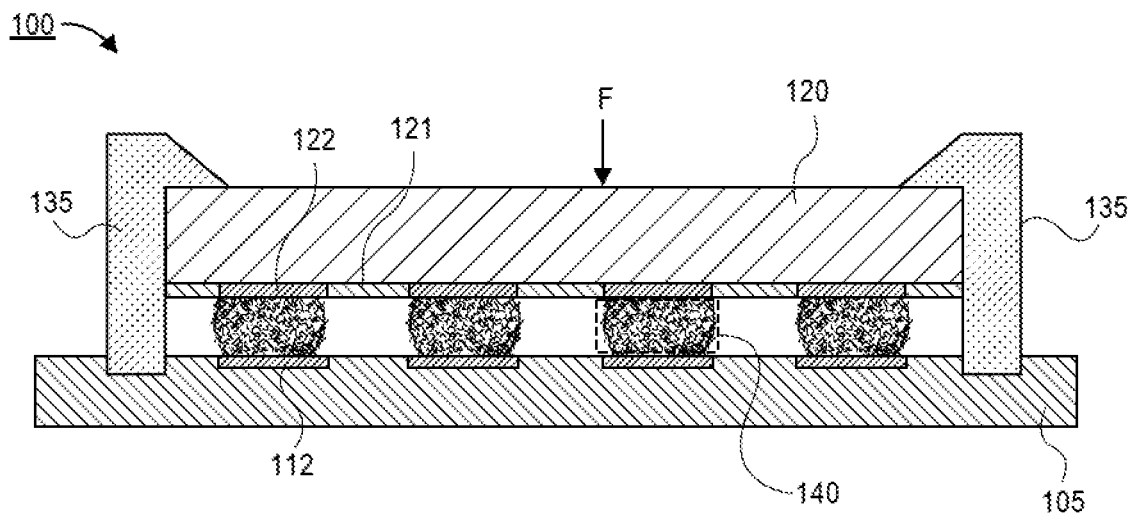
FIG. 1A is a cross-sectional illustration of an electronics package that comprises stranded mesh interconnects between the package substrate and the printed circuit board (PCB), in accordance with an embodiment.

Referring now to FIG. 1A, a cross-sectional illustration of an electronics package 100 is shown, in accordance with an embodiment. In an embodiment, the electronics package 100 may comprise a first substrate 105. The first substrate 105 may be any suitable substrate, such as a printed circuit board (PCB), a package substrate, an interposer, a die or the like. In the particular embodiment shown in FIG. 1A, the first substrate 105 may be considered to be a PCB. In an embodiment, a plurality of first pads 112 may be formed on the first substrate 105.

In an embodiment, the electronics package 100 may further comprise a second substrate 120 that is positioned above the first substrate 105. In an embodiment, the second substrate 120 may be any suitable substrate, such as a PCB, a package substrate, an interposer, a die, or the like. In the particular embodiment shown in FIG. 1A, the second substrate 120 may be considered a package substrate. That is, the package substrate 120 may comprise one or more component dies (not shown) that are packaged onto a packaging substrate 121. In an embodiment, a plurality of second pads 122 may be formed on the second substrate 120. In an embodiment, each of the plurality of second pads 122 may be positioned directly above different ones of the first pads 112 on the first substrate 105.

In an embodiment, a plurality of solder-free interconnects 140 may electrically couple first pads 112 to second pads 122. In a particular embodiment, the solder-free interconnects 140 may be any interconnect that is substantially free of solder typically used in BGA solder interconnects (e.g., tin-silver-copper (SAC), other lead-free solders, or the like). In an embodiment, the solder-free interconnects 140 may comprise a material that does not require a reflow in order to provide electrical coupling between the first pads 112 and the second pads 122.

In an embodiment, the solder-free interconnects 140 may comprise a stranded mesh. Stranded mesh interconnects may comprise one or more strands of conductive material that are wound on themselves to form a high density bulk shape. For example, the strands of conductive material may comprise a conductive core and a conductive shell surrounding the core. A more detailed description of the strands of conductive material is provided below with respect to FIG. 3.

In an embodiment, solder-free interconnects 140 that are formed with a stranded mesh may provide several benefits compared to traditional solder balls. For one, the materials chosen for the stranded mesh may provide a reduction in resistance of the solder-free interconnects 140 compared to solder balls. For example, when the stranded mesh comprises copper, the resistance of the solder-free interconnects 140 may be lower than the resistance of SAC based solders. Additionally, the stranded mesh configuration results in a spring-like behavior of the solder-free interconnects 140. That is, stresses and vibrations that may result in failure of solder balls may be absorbed by the stranded mesh. In yet another advantage, the solder-free interconnects 140 provide increased flexibility during repair or replacement of components. Since the solder-free interconnects 140 are not reflown, components are easier to disassemble when repairs or replacements are needed.

In an embodiment, retention clips 135 may mechanically couple the first substrate 105 to the second substrate 120. For example, the retention clips 135 may apply a clamping force F (as indicated by the arrow) that orients and secures the first substrate 105 to the second substrate 120. In an embodiment, the clamping force F may result in the solder-free interconnects 140 being compressed between the first pads 112 and the second pads 122. The compression of the solder-free interconnects 140 results in the stranded mesh forming excellent contact with the first pads 112 and the second pads 122. It is to be appreciated that such a solder-free interconnect 140 architecture differs from traditional solder ball architectures in that solder balls electrically and mechanically couple the first substrate 105 to the second substrate 120, whereas the solder-free interconnect 140 architecture (i.e., the stranded mesh) electrically couples the first substrate 105 to the second substrate 120, but the solder free interconnect 140 does not mechanically couple the first substrate 105 to the second substrate 120. Furthermore, it is to be appreciated that the retention clips 135 may be designed so that they do not significantly increase the Z-height of the electronics package 100.

Figure 1B:
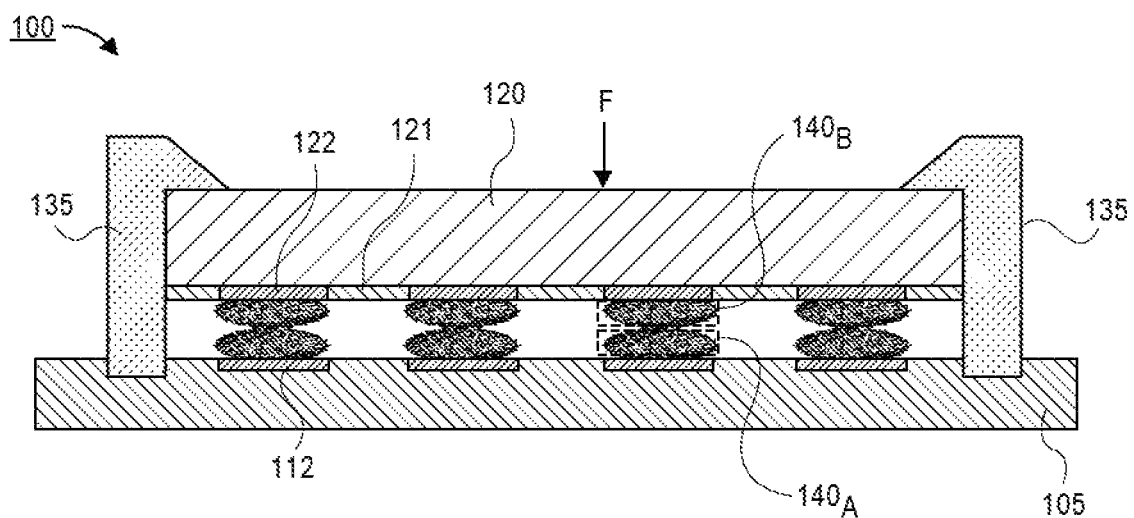
FIG. 1B is a cross-sectional illustration of an electronics package that comprises first stranded mesh interconnects and second stranded mesh interconnects between the package substrate and the PCB, in accordance with an embodiment.

Referring now to FIG. 1B, a cross-sectional illustration of an electronics package 100 is shown, in accordance with an additional embodiment. In an embodiment, the electronics package 100 is substantially similar to the electronics package 100 described in FIG. 1A, with the exception that a pair of solder-free interconnects 140A and 140E are positioned between first pads 112 and second pads 122. In such an embodiment, first solder-free interconnects 140A may be positioned over the first pads 112 and second solder-free interconnects 140E may be positioned under the second pads 122. A surface of the first solder-free interconnects 140A may contact a surface of the second solder-free interconnects 140E in order to electrically couple first pads 112 to second pads 122.

In an embodiment, the first solder-free interconnects 140A may be secured to the second solder-free interconnects 140E by the clamping force F applied by the retention clips 135. In embodiments where the solder-free interconnects 140A and 140E are stranded meshes, the strands of the first solder-free interconnect 140A may contact strands of the second solder-free interconnect 140B. In a particular embodiment, the clamping force F may result in strands of the first solder-free interconnect 140A and strands of the second solder-free interconnect 140E to mechanically coupling to each other, similar to a hook and loop interface.

Referring now to FIGS. 2A-2D, cross-sectional illustrations of solder-free interconnects 240 are shown, in accordance with various embodiments. For simplicity, outlines of the bulk shapes of the solder-free interconnects 240 are shown. That is, it is to be appreciated that the bulk shapes shown may not have sharp edges. Instead, embodiments include a stranded mesh that generally conforms to the outline of the bulk shapes shown in FIGS. 2A-2D. Embodiments may include one or more strands that are woven on themselves to form a mesh-like structure that has a bulk shape that is substantially similar to the outlines shown in each of the FIGS. 2A-2D. For example, the density of the solder-free interconnects 240 will be less than if the bulk shape was entirely filled with the conductive material of the conductive strands. In an embodiment, the density of the solder-free interconnects 240 may be approximately 95% or less, 75% or less, or 50% or less than the density of conductive materials used to form the conductive strands.

Figure 2C:
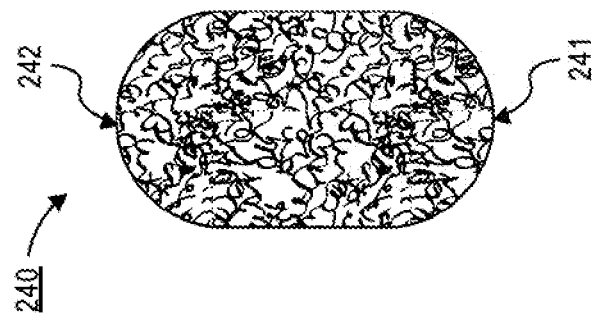
FIG. 2C is a cross-sectional illustration of a stranded mesh interconnect with a cylindrical bulk shape with a first convex surface and a second convex surface, in accordance with an embodiment.
Figure 2B:
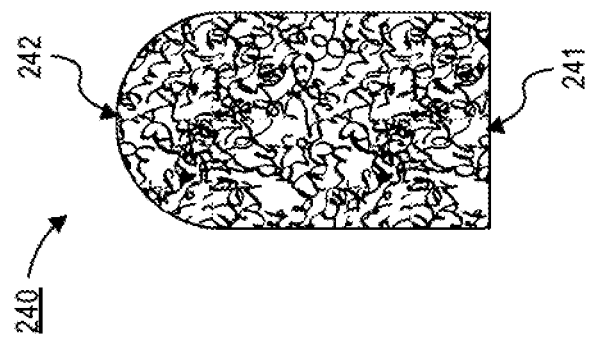
FIG. 2B is a cross-sectional illustration of a stranded mesh interconnect with a cylindrical bulk shape and a convex surface, in accordance with an embodiment.
Figure 2A:
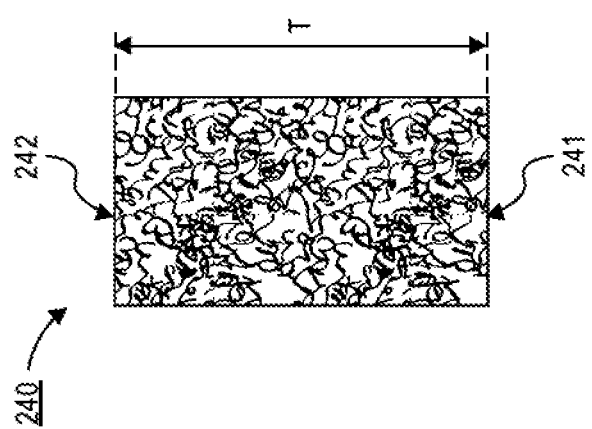
FIG. 2A is a cross-sectional illustration of a stranded mesh interconnect with a cylindrical bulk shape, in accordance with an embodiment.

Referring now to FIG. 2A, a cross-sectional illustration of a solder-free interconnect 240 is shown, in accordance with an embodiment. In an embodiment, the cross-sectional bulk shape of the interconnect 240 is rectangular. For example, a substantially planar first surface 241 may be opposite from a substantially planar second surface 242. In an embodiment, the first surface 241 may be spaced away from the second surface 242 by a thickness T. The thickness T may be substantially similar to the thickness of solder balls used in other architectures. For example, the thickness T may be between 100 microns and 1,000 microns.

In the illustrated embodiment, the cross-sectional view is shown but it is to be appreciated that the solder-free interconnect 240 may have any three-dimensional shape with the illustrated cross-section. For example, the bulk-shape of the solder-free interconnect 240 may be cylindrical, rectangular cuboid, cubed, or, any other desired shape.

Referring now to FIG. 2B, a cross-sectional illustration of a solder-free interconnect 240 is shown, in accordance with an additional embodiment. The solder-free interconnect 240 may be substantially similar to the solder-free interconnect 240 shown in FIG. 2A, with the exception that the second surface 242 is concaved. That is, the first surface 241 is not substantially parallel to the second surface 242. In an embodiment, the three-dimensional bulk shape may be referred to as substantially cylindrical with a domed second surface 242.

Referring now to FIG. 2C, a cross-sectional illustration of a solder-free interconnect 240 is shown, in accordance with an additional embodiment. The solder-free interconnect 240 may be substantially similar to the solder-free interconnect 240 shown in FIG. 2B, with the exception that the first surface 241 is also concaved. In an embodiment, the three-dimensional bulk shape may be referred to as cylindrical with a domed first surface 241 and a domed second surface 242.

Figure 2D:
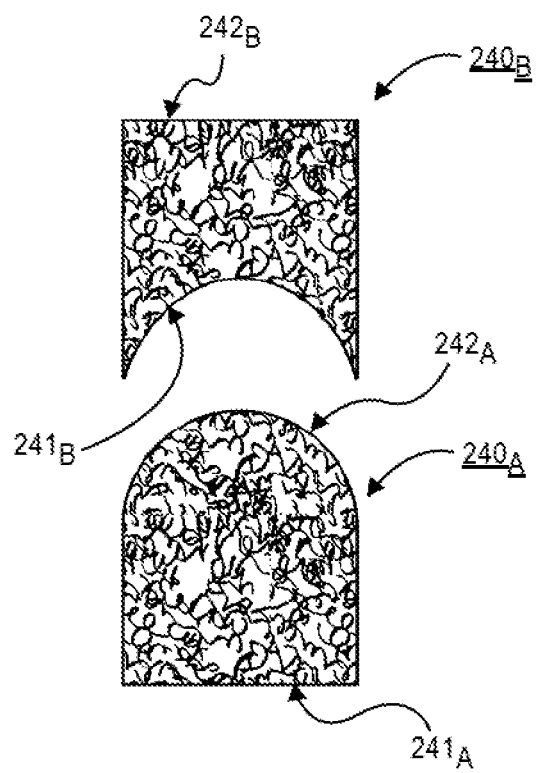
FIG. 2D is a cross-sectional illustration of a first stranded mesh interconnect and a second stranded mesh interconnect, where opposing surfaces of the first stranded mesh interconnect and the second stranded mesh interconnect are reciprocal interfaces, in accordance with an embodiment.

Referring now to FIG. 2D, a cross-sectional illustration of a first solder-free interconnect 240A and a second solder-free interconnect 240B are shown, in accordance with an embodiment. In an embodiment, the second surface 242A of the first solder-free interconnect 240A may be a reciprocal shape of the first surface 241E of the second solder-free interconnect 240B. Accordingly, the interface between the first solder-free interconnect 240A and the second solder-free interconnect 240B may be improved when mated together (e.g., similar to the configuration shown in FIG. 1B). In the illustrated embodiment, the second surface 242A of the first solder-free interconnect 240A is convex and the first surface 241E of the second solder-free interconnect 240B is concave. It is to be appreciated that the illustrated reciprocal shapes are exemplary in nature, and embodiments may include any reciprocally shaped surfaces to form the interface between the first solder-free interconnect 240A and the second solder-free interconnect 240B.

Figure 3:
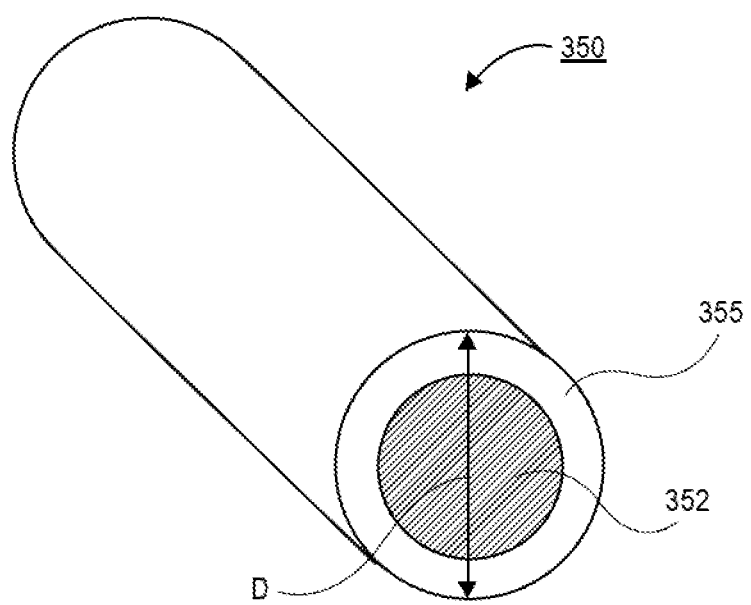
FIG. 3 is a perspective view illustration of a conductive strand used in the stranded mesh interconnects, in accordance with an embodiment.

Referring now to FIG. 3, a perspective view illustration of a conductive strand 350 that may be used to form the stranded mesh of the solder-free interconnects is shown, in accordance with an embodiment. In an embodiment, the conductive strand 350 may comprise a conductive core 352. In embodiments where the conductive core 352 is a material that is easily oxidized (or otherwise damaged), a protective shell 355 may be formed around the conductive core 352. The protective shell 355 may also be conductive. In a particular embodiment, the conductive core 352 may be copper and the protective shell 355 may be gold. However, it is to be appreciated that any combination of materials (including more than two materials) may be used.

In an embodiment, the conductive strand 350 may have a diameter D. The diameter D may be any diameter that allows for the formation of a stranded mesh that has the bulk form factor such as those described above. Particularly, the diameter D may be small enough to allow for a bulk shape with a density of the stranded mesh that provides sufficient electrical performance for the solder-free interconnect. For example, the diameter D may be 100 microns or smaller, 50 microns or smaller, or 20 microns or smaller.

Figure 4A:
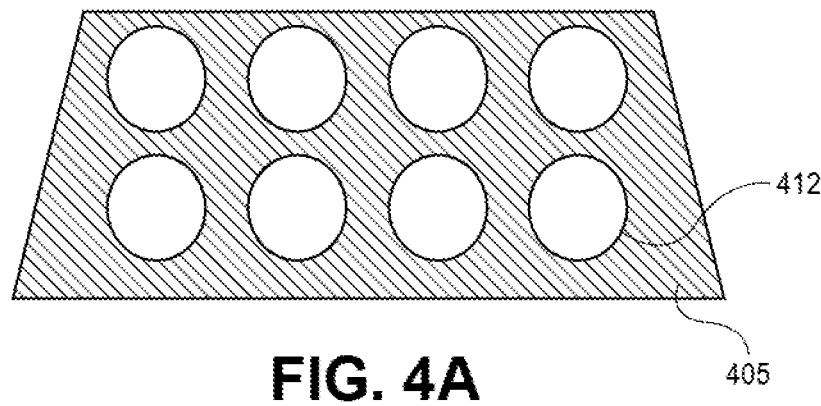
FIG. 4A is a plan view illustration of a substrate with conductive pads, in accordance with an embodiment.
Figure 4B:
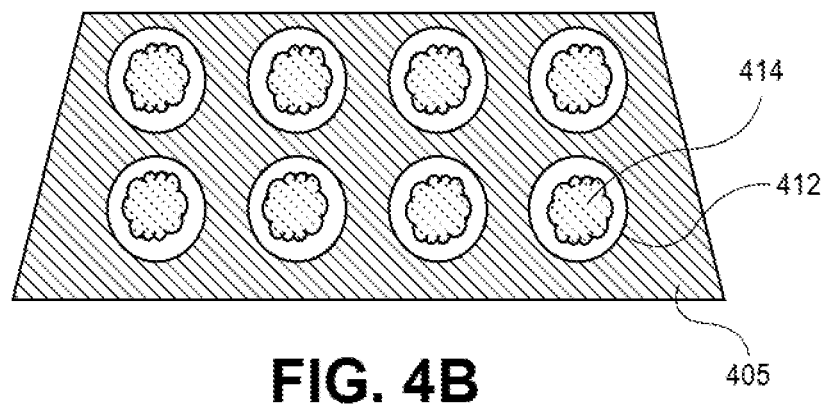
FIG. 4B is a plan view illustration after conductive epoxy is applied to the conductive pads, in accordance with an embodiment.
Figure 4C:
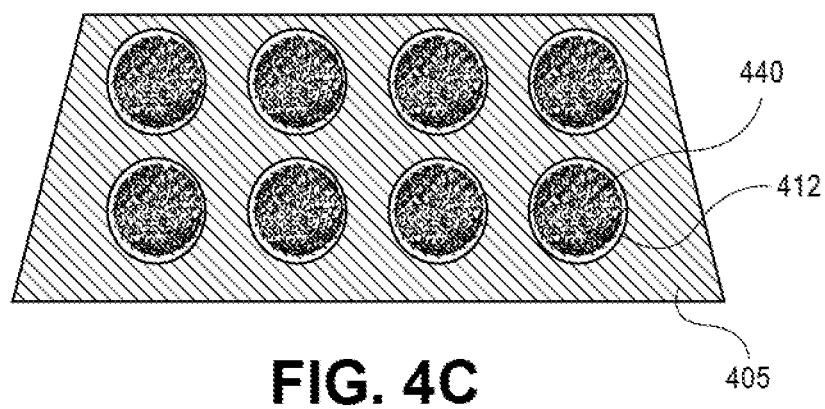
FIG. 4C is a plan view illustration after stranded mesh interconnects are attached to the conductive pads with the conductive epoxy, in accordance with an embodiment.

Referring now to FIGS. 4A-4C, a series of plan view illustrations that depict a process for attaching the solder-free interconnects to pads on a substrate is shown, in accordance with an embodiment.

Referring now to FIG. 4A, a plan view illustration of first substrate 405 with first pads 412 is shown, in accordance with an embodiment. In an embodiment, the first substrate 405 may be any substrate on which conductive pads are formed. For example, the first substrate 405 may be a PCB, a package substrate, an interposer, a die, or the like. In an embodiment, the first pads 412 may be defined by a solder resist (not shown).

Referring now to FIG. 4B, a plan view illustration after a conductive epoxy 414 is applied to the first pads 412 is shown, in accordance with an embodiment. In an embodiment, the conductive epoxy 414 may be applied onto the first pads 412 in order to provide a substance that will adhere the solder-free interconnects to the first pads 412. Particularly, the solder-free interconnects do not mechanically couple by themselves and an adhesive may be needed in order to secure the solder-free interconnects to the first pads 412 in a high volume manufacturing (HVM) environment. In an embodiment, the conductive epoxy 414 may be applied with an ink jetting process or the like.

Referring now to FIG. 4C, a cross-sectional illustration after the solder-free interconnects 440 are placed over the first pads 412 is shown, in accordance with an embodiment. In an embodiment, the solder-free interconnects 440 are secured to the first pads 412 by the conductive epoxy (not visible in FIG. 4C since the conductive epoxy is below the solder-free interconnects 440). Accordingly, the first substrate 405 may be moved about an assembly facility without the solder-free interconnects 440 separating from the first conductive pad 412 on which it was placed. In an embodiment, the solder-free interconnects 440 may be placed onto the first pads 412 with a pick-and-place tool, a tape and reel tool, or the like.

After the solder-free interconnects 440 are applied to the first pads 412, a second substrate (not shown) may be oriented over the first substrate 405 and secured with retention clips (similar to what is shown in FIG. 1A). In an embodiment, the second substrate may also have solder-free interconnects positioned on pads to form an electronics package similar to what is shown in FIG. 1B.

Figure 5:
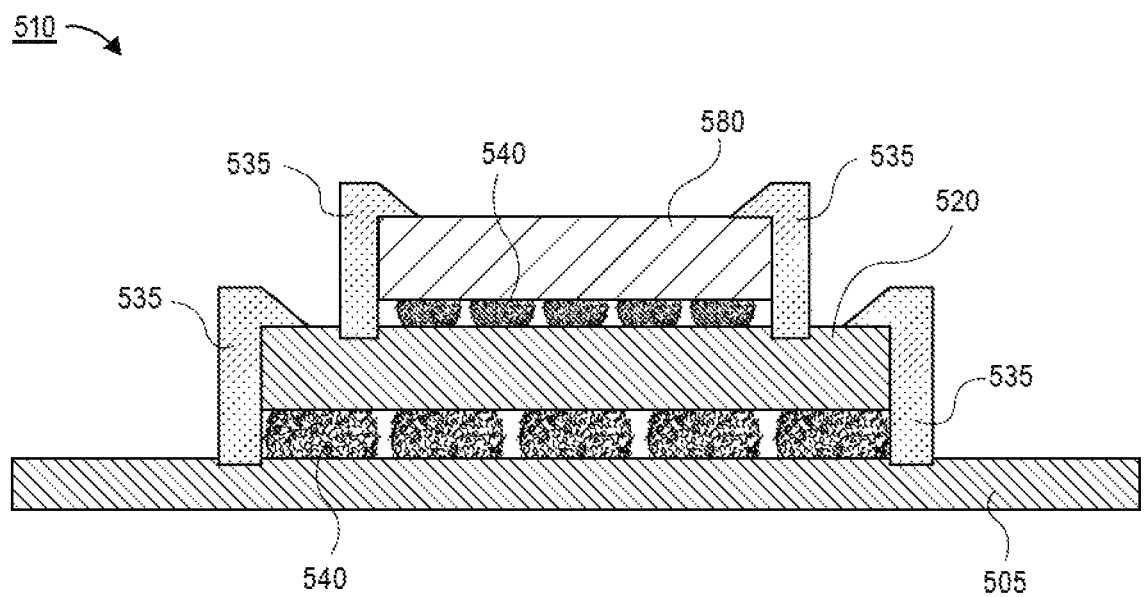
FIG. 5 is a cross-sectional illustration of a packaged electronics system with solder-free interconnects comprising a stranded mesh, in accordance with an embodiment.

Referring now to FIG. 5, a cross-sectional illustration of a packaged system 510 is shown, in accordance with an embodiment. In an embodiment, the packaged system 510 may include a die 580 electrically coupled to a package substrate 520 with solder-free interconnects 540. For example, the solder-free interconnects 540 may comprise a stranded mesh, such as embodiments described above. In an embodiment, the die 580 may be mechanically coupled to the package substrate 520 with retention clips 535. The retention clips 535 may apply a clamping force that compresses the solder-free interconnects 540 between conductive pads (not shown).

In an embodiment, the package substrate 520 may be electrically coupled to a board 505, such as a printed circuit board (PCB) with solder-free interconnects 540. For example, the solder-free interconnects 540 may comprise a stranded mesh, such as embodiments described above. In an embodiment, the package substrate 520 may be mechanically coupled to the board 505 with retention clips 535. The retention clips 535 may apply a clamping force that compresses the solder-free interconnects 540 between conductive pads (not shown).

Figure 6:
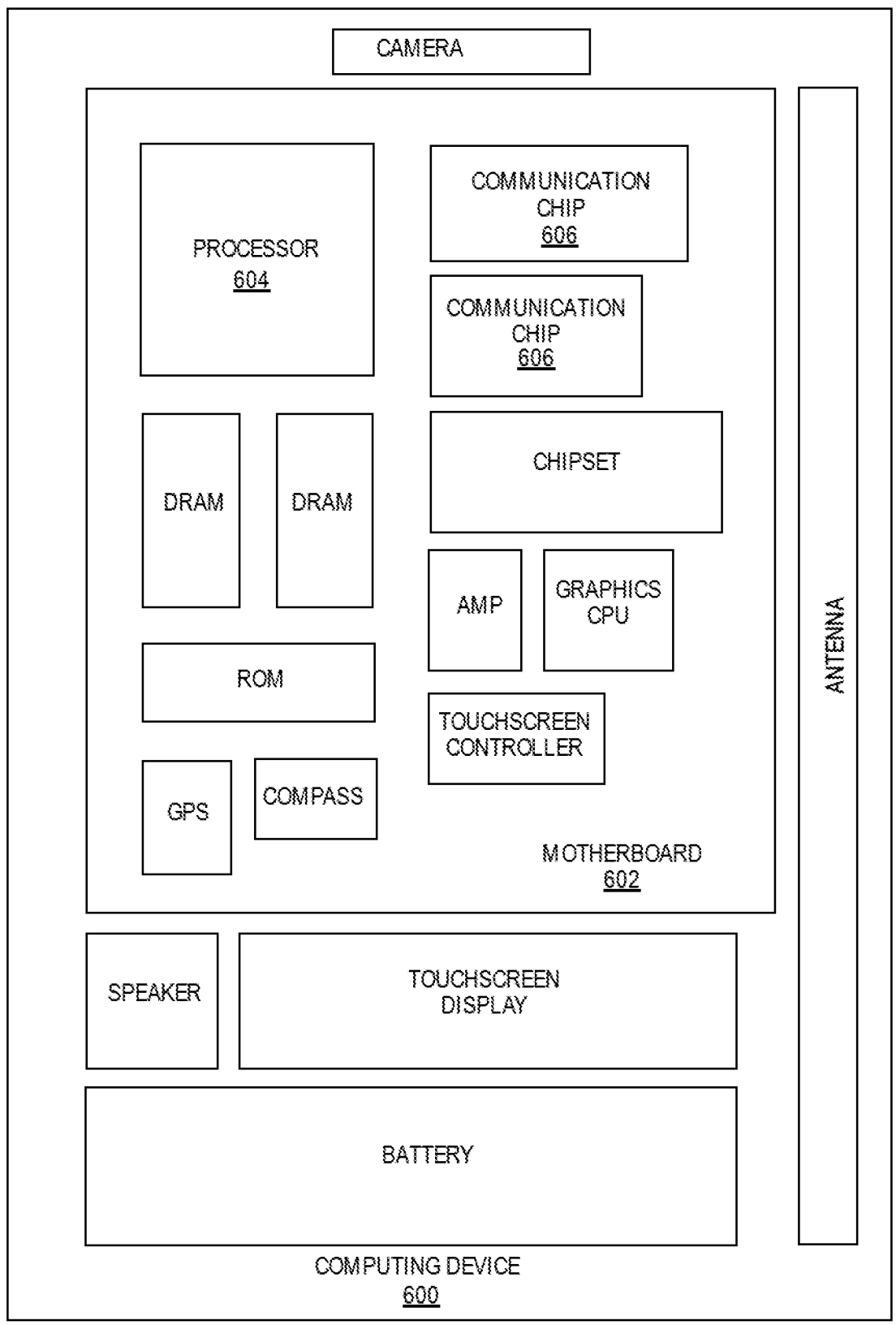
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be packaged in an electronics system that comprises solder-free interconnects, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be packaged in an electronics system that comprises solder-free interconnects, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronics package, comprising: a first substrate; a plurality of first conductive pads on the first substrate; a second substrate; a plurality of second conductive pads on the second substrate; and a plurality of interconnects between the first and second substrate, wherein each interconnect electrically couples one of the first conductive pads to one of the second conductive pads, and wherein the interconnects comprise strands of conductive material.

Example 2: the electronics package of Example 1, wherein the strands of conductive material comprise copper.

Example 3: the electronics package of Example 1 or Example 2, wherein the strands of conductive material further comprise gold plating around the copper.

Example 4: the electronics package of Examples 1-3, wherein the strands of cond4ctive material are wound to form a stranded mesh having a bulk shape.

Example 5: the electronics package of Examples 1-4, wherein the bulk shape is cylindrical.

Example 6: the electronics package of Examples 1-5, wherein the bulk shape is cylindrical with a convex end surface.

Example 7: the electronics package of Examples 1-6, wherein the bulk shape is cylindrical with a first convex end surface and a second convex end surface.

Example 8: the electronics package of Examples 1-7, wherein the bulk shape comprises a concave end surface.

Example 9: the electronics package of Examples 1-8, further comprising an adhesive securing the interconnects to one of the first conductive pads or the second conductive pads.

Example 10: the electronics package of Examples 1-9, further comprising: retention clips for mechanically securing the first substrate to the second substrate.

Example 11: the electronics package of Examples 1-10, wherein the strands have a diameter of 20 microns or greater.

Example 12: the electronics package of Examples 1-11, wherein the first substrate is a printed circuit board (PCB).

Example 13: the electronics package of Examples 1-12, wherein the second substrate is a packaging substrate.

Example 14: an electronics system, comprising: a first substrate having a first conductive pad; a second substrate having a second conductive pad; and a solder-free interconnect electrically coupling the first conductive pad to the second conductive pad.

Example 15: the electronics system of claim 14, wherein the solder-free interconnect comprises a conductive strand wound into a stranded mesh.

Example 16: the electronics system of Example 14 or Example 15, wherein the stranded mesh is cylindrical in shape.

Example 17: the electronics system of Examples 14-16, wherein one or both of the end surfaces of the cylindrical shape are convex.

Example 18: the electronics system of Examples 14-17, wherein the solder-free interconnect comprises a first stranded mesh in contact with the first conductive pad and a second stranded mesh in contact with the second conductive pad, and wherein a surface of the first stranded mesh interfaces with a surface of the second stranded mesh.

Example 19: the electronics system of Examples 14-18, wherein the interface between the first stranded mesh and the second mesh is formed by reciprocal surfaces.

Example 20: the electronics system of Examples 14-19, further comprising: a retention clip for mechanically coupling the first substrate to the second substrate.

Example 21: the electronics system of Examples 14-20, wherein the retention clip applies a clamping force on the first and second substrate that compresses the solder-free interconnect.

Example 22: a method of forming an electronics package, comprising: applying a conductive epoxy onto a first conductive pad formed on a first substrate; placing a stranded mesh onto the conductive epoxy, wherein the conductive epoxy secures the stranded mesh to the conductive pad; and positioning a second substrate over the first substrate, wherein a second conductive pad on the second substrate contacts the stranded mesh.

Example 23: the method of Example 22, further comprising: securing the second substrate to the first substrate with retention clips.

Example 24: the method of Example 22 or Example 23, wherein the stranded mesh comprises a copper core and gold plating.

Example 25: the method of Examples 22-24, wherein the stranded mesh is placed on the conductive epoxy with a pick-and-place tool or a tape and reel tool.

What is claimed is:

1. An electronics package, comprising:
   a first substrate;
   a plurality of first conductive pads on the first substrate;
   a second substrate;
   a plurality of second conductive pads on the second substrate; and
   a plurality of interconnects between the first and second substrate, wherein each interconnect electrically couples one of the first conductive pads to one of the second conductive pads, and wherein each of the interconnects comprises a plurality of strands of conductive material, wherein the plurality of strands of conductive material of each interconnect are woven on themselves to form a mesh-like structure, and wherein each of the plurality of strands of conductive material of each interconnect comprises a conductive core, and a protective shell around the conductive core; and
   each of the plurality of strands have a diameter equal to or less than 100 microns and the interconnect has a form factor that matches with a form factor of a solder ball of a Ball Grid Array.

2. The electronics package of claim 1, wherein the plurality of strands of conductive material comprise copper.

3. The electronics package of claim 2, wherein the plurality of strands of conductive material further comprise gold plating around the copper.

4. The electronics package of claim 1, wherein the plurality of strands of conductive material are wound to form a stranded mesh having a bulk shape.

5. The electronics package of claim 4, wherein the bulk shape is cylindrical.

6. The electronics package of claim 4, wherein the bulk shape is cylindrical with a convex end surface.

7. The electronics package of claim 6, wherein the bulk shape is cylindrical with a first convex end surface and a second convex end surface.

8. The electronics package of claim 4, wherein the bulk shape comprises a concave end surface.

9. The electronics package of claim 1, further comprising an adhesive securing the interconnects to one of the first conductive pads or the second conductive pads.

10. The electronics package of claim 1, further comprising:
    retention clips for mechanically securing the first substrate to the second substrate.

11. The electronics package of claim 1, wherein each of the plurality of strands have a diameter of 20 microns or greater.

12. The electronics package of claim 1, wherein the first substrate is a printed circuit board (PCB).

13. The electronics package of claim 12, wherein the second substrate is a semiconductor package substrate.

14. An electronics system including a plurality of integrated circuits, wherein the electronics system comprising:
    a first substrate having a first conductive pad;
    a second substrate having a second conductive pad; and
    a solder-free interconnect electrically coupling the first conductive pad to the second conductive pad, wherein the solder-free interconnect comprises a plurality of strands of conductive material, wherein the plurality of strands of conductive material of the solder-free interconnect are woven on themselves to form a mesh-like structure, and wherein each of the plurality of strands of conductive material of the solder-free interconnect comprises a conductive core, and a protective shell around the conductive core; and
    each of the plurality of strands have a diameter equal to or less than 100 microns and the solder-free interconnect has a form factor that matches with a form factor of a solder ball of a Ball Grid Array.

15. The electronics system of claim 14, wherein the solder-free interconnect comprises a stranded mesh.

16. The electronics system of claim 15, wherein the stranded mesh is cylindrical in shape.

17. The electronics system of claim 16, wherein one or both of the end surfaces of the cylindrical shape are convex.

18. The electronics system of claim 14, wherein the solder-free interconnect comprises a first stranded mesh in contact with the first conductive pad and a second stranded mesh in contact with the second conductive pad, and wherein a surface of the first stranded mesh interfaces with a surface of the second stranded mesh.

19. The electronics system of claim 18, wherein the interface between the first stranded mesh and the second mesh is formed by mated surfaces.

20. The electronics system of claim 14, further comprising:
    a retention clip for mechanically coupling the first substrate to the second substrate.

21. The electronics system of claim 20, wherein the retention clip applies a clamping force on the first and second substrate that compresses the solder-free interconnect.

* * * * *